(12) United States Patent
Hoshi et al.

(10) Patent No.: US 9,783,912 B2
(45) Date of Patent: Oct. 10, 2017

(54) SILICON SINGLE CRYSTAL GROWING APPARATUS AND METHOD FOR GROWING SILICON SINGLE CRYSTAL

(71) Applicant: SHIN-ETSU HANDOTAI CO., LTD., Tokyo (JP)

(72) Inventors: Ryoji Hoshi, Nishigo-mura (JP); Kosei Sugawara, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 265 days.

(21) Appl. No.: 14/425,394

(22) PCT Filed: Aug. 26, 2013

(86) PCT No.: PCT/JP2013/005009
§ 371 (c)(1),
(2) Date: Mar. 3, 2015

(87) PCT Pub. No.: WO2014/054214
PCT Pub. Date: Apr. 10, 2014

(65) Prior Publication Data
US 2015/0240379 A1    Aug. 27, 2015

(30) Foreign Application Priority Data
Oct. 3, 2012    (JP) ................................ 2012-221472

(51) Int. Cl.
*C30B 15/06* (2006.01)
*C30B 15/14* (2006.01)
(Continued)

(52) U.S. Cl.
CPC .............. *C30B 15/14* (2013.01); *C30B 15/12* (2013.01); *C30B 29/06* (2013.01); *Y10T 117/1052* (2015.01)

(58) Field of Classification Search
CPC .......... C30B 15/00; C30B 15/10; C30B 15/14
See application file for complete search history.

(56) References Cited

U.S. PATENT DOCUMENTS

| 5,361,721 A | 11/1994 | Takano et al. |
| 5,373,805 A | 12/1994 | Takano et al. |

(Continued)

FOREIGN PATENT DOCUMENTS

| CN | 1272146 A | 11/2000 |
| CN | 1341168 A | 3/2002 |

(Continued)

OTHER PUBLICATIONS

Aug. 2, 2016 Office Action and Search Report issued in Chinese Patent Application No. 201380047665.1.
(Continued)

*Primary Examiner* — Robert M Kunemund
(74) *Attorney, Agent, or Firm* — Oliff PLC

(57) ABSTRACT

A silicon single crystal growing apparatus based on a Czochralski method arranges a graphite crucible inside a graphite heater for heating and a quartz crucible inside the graphite crucible and grows a crystal from a raw material melt filling the quartz crucible, and includes a heater outer heat-insulating member outside the graphite heater, a crucible lower heat-insulating member below the graphite crucible, a crucible upper heat-insulating member above straight bodies of the graphite and quartz crucibles, a crucible outer heat-insulating member outside the straight body of the graphite crucible, a crucible inner heat-insulating member inside the straight bodies of the graphite crucible and the quartz crucible, and a heat shielding member above a liquid surface of the raw material melt, the graphite crucible and the quartz crucible being movable upward and downward in a space enclosed with the crucible upper
(Continued)

heat-insulating, crucible outer heat-insulating, and crucible inner heat-insulating members.

8 Claims, 5 Drawing Sheets

(51) Int. Cl.
    *C30B 29/06*     (2006.01)
    *C30B 15/12*     (2006.01)

(56) References Cited

U.S. PATENT DOCUMENTS

| | | | |
|---|---|---|---|
| 5,788,718 | A | 8/1998 | Yamagishi et al. |
| 5,935,326 | A * | 8/1999 | Kotooka ................. C30B 15/14 117/217 |
| 6,071,341 | A | 6/2000 | Shimanuki et al. |
| 6,197,111 | B1 | 3/2001 | Ferry et al. |
| 2003/0010276 | A1 | 1/2003 | Abe et al. |
| 2006/0021567 | A1* | 2/2006 | Okita ...................... C30B 15/10 117/217 |
| 2007/0163485 | A1 | 7/2007 | Fabry et al. |
| 2008/0053372 | A1* | 3/2008 | Anttila .................... C30B 15/14 117/200 |
| 2008/0078322 | A1* | 4/2008 | Kawazoe ................ C30B 15/00 117/217 |
| 2010/0258050 | A1 | 10/2010 | Hoshi et al. |
| 2010/0288185 | A1* | 11/2010 | Filar ....................... C30B 15/14 117/13 |
| 2010/0326349 | A1* | 12/2010 | Fukui ...................... C30B 15/10 117/15 |
| 2012/0000416 | A1* | 1/2012 | Wang ...................... C30B 15/14 117/217 |
| 2013/0247815 | A1 | 9/2013 | Sugawara et al. |

FOREIGN PATENT DOCUMENTS

| | | |
|---|---|---|
| CN | 1406291 A | 3/2003 |
| CN | 1417386 A | 5/2003 |
| CN | 2744697 Y | 12/2005 |
| CN | 2804129 Y | 8/2006 |
| CN | 101024894 A | 8/2007 |
| CN | 101560691 A | 10/2009 |
| CN | 101864591 A | 10/2010 |
| CN | 101910474 A | 12/2010 |
| JP | S64-065086 A | 3/1989 |
| JP | H05-009097 A | 1/1993 |
| JP | H05-105578 A | 4/1993 |
| JP | H05-221779 A | 8/1993 |
| JP | H06-340490 A | 12/1994 |
| JP | H09-183686 A | 7/1997 |
| JP | H09-278581 A | 10/1997 |
| JP | H09-309789 A | 12/1997 |
| JP | 2000-119089 A | 4/2000 |
| JP | 2001-010890 A | 1/2001 |
| JP | 2001-139392 A | 5/2001 |
| JP | 2002-154895 A | 5/2002 |
| JP | 2002-220296 A | 8/2002 |
| JP | 2003-212691 A | 7/2003 |
| JP | 2003-243404 A | 8/2003 |
| JP | 2009-263197 A | 11/2009 |
| JP | 2011-020882 A | 2/2011 |
| JP | 2012-148918 A | 8/2012 |
| WO | 99/16939 A1 | 4/1999 |

OTHER PUBLICATIONS

Nov. 4, 2015 Office Action issued in Japanese Patent Application No. 2012-221472.
Apr. 7, 2015 International Preliminary Report on Patentability issued in International Application No. PCT/JP2013/005009.
Sep. 1, 2015 Office Action issued in Japanese Patent Application No. 2012-221472.
Nov. 12, 2013 International Search Report issued in International Application No. PCT/JP2013/005009.
Feb. 13, 2017 Office Action issued in Chinese Patent Application No. 201380047665.1.
Jun. 5, 2017 Office Action issued in Chinese Application No. 2013800476651.

* cited by examiner

SILICON SINGLE CRYSTAL GROWING APPARATUS AND METHOD FOR GROWING SILICON SINGLE CRYSTAL

TECHNICAL FIELD

The present invention relates to a silicon single crystal growing apparatus and a method for growing silicon single crystal based on the Czochralski method.

BACKGROUND ART

Many silicon wafers are used in semiconductor industries, and growth of a silicon single crystal being a base material thereof is an important technology. To grow the silicon single crystal, a floating zone (FZ) method for locally melting a silicon ingot to form a single crystal by heating using an induction coil and a Czochralski (CZ) method for melting a silicon raw material in a crucible by heating using a heater and pulling a single crystal from a molten melt are available. The crucible in the CZ method generally has a double structure constituted of a quartz crucible made of silicon and oxygen and a graphite crucible that supports the quartz crucible to prevent a shape of the quartz crucible from collapsing due to softening at high temperatures. According to the CZ method, oxygen eluted from the quartz crucible is taken into silicon in a grown crystal, and oxygen precipitates are formed in a wafer sliced out from this crystal by, e.g., a heat treatment in a device and exercise a gettering effect of capturing impurities during a device process. Further, since increasing a diameter is relatively easier in the CZ method than in the FZ method, the CZ method has become mainstream as a method for industrially growing a silicon single crystal.

Since movement of electrons or holes enables a device formed on a silicon wafer to operate, a dislocation in the wafer might cause a problem such as leak of an electric current. Therefore, the silicon wafer serving as a raw material in formation of a device must have no dislocation. Thus, an original crystal from which silicon wafers are to be sliced out must be a single crystal having no dislocation. Since the crystal is grown at high temperatures, when a dislocation occurs during crystal growth, the dislocation glides or increases, resulting in occurrence of many dislocations. Since a wafer sliced out from such a crystal having dislocations includes many dislocations, an advanced device cannot be fabricated thereon. Thus, the occurrence of dislocations is a serious problem in the crystal growth. However, in spite of studies conducted over the years, the occurrence of dislocations is yet to be completely prevented.

Causes of the occurrence of dislocations during the crystal growth in the CZ method are considered to include internal stress during the crystal growth, various kinds of sparingly-soluble materials, and others. As regards the internal stress that contributes to the occurrence of dislocations in a crystal, for example, greatly raising a growth rate of the crystal increases solidification latent heat generated when a liquid changes into a solid, and a crystal growth interface that is an isotherm of a melting point has an upwardly protruding shape to cause a rise in its height. When the height of the crystal growth interface rises, a temperature gradient in a direction vertical to a crystal growth axis increases, enlarging stress in a central portion of the crystal. It is empirically known that the increase in this stress above a certain level leads to the occurrence of dislocations. To avoid this occurrence, for example, removing the generated solidification latent heat by enhancing cooling of the crystal lowers the height of the crystal growth interface, and the stress can be consequently decreased to prevent dislocations from occurring. An easier method is to decrease the solidification latent heat by reducing a growth rate. In general, a crystal is ordinarily grown within the limit of growth rates that avoid the occurrence of dislocations due to internal stress, and the occurrence of dislocations due to the internal stress is not a particularly serious problem.

Sparingly-soluble materials as another cause of the occurrence of dislocations are considered to include an impurity derived from in-furnace components, e.g., a graphite material, a heat-insulating member, or a wire present in the furnace, $SiO_2$ provided when the quartz crucible is partially delaminated due to crystallization/degradation/air bubble opening of the quartz crucible, Sb provided when volatile silicon oxide (SiO) resulting from a reaction of oxygen eluted into a silicon melt from the quartz crucible and silicon adheres to and solidifies on a cooled portion such as a tip of a straight body of the crucible or a chamber and it again falls into the raw material melt, and solidification of the raw material melt caused due to unevenness or fluctuation of temperatures of the raw material melt. For example, contriving shapes of the in-furnace components can relatively easily develop a solution for the impurity derived from the components among others.

As to generation of the $SiO_2$ sparingly-soluble materials due to degradation of the quartz crucible, for example, in Patent Literature 1, degradation prevention is taken by adjusting a furnace internal pressure during an operation. Furthermore, various technologies that improve quality of the quartz crucible itself are disclosed.

As regards the problem that the volatile SiO solidifies and falls, for example, Patent Literature 2 discloses a technology that straightens the volatile SiO or a gas such as CO or $CO_2$ produced in a heater section with the use of, e.g., an argon gas flowing from above by providing a cylinder (a gas flow guide cylinder) that surrounds a crystal and a collar at a lower end thereof, avoiding adhesion to components above a crucible. Moreover, Patent Literature 3 discloses that an outer peripheral portion of a collar is extended to an upper portion of a straight body of a crucible to keep an upper end portion of the straight body of the crucible warm, preventing SiO from adhering. Additionally, although an object is different, Patent Literature 4 discloses a structure that is a combination of an inverse conical heat shielding member having a heat insulator and an outer heat-insulating member of a straight body of a crucible, each of Patent Literatures 5 and 6 discloses a heat-insulating member that projects to a position near a straight body of a crucible above a heater, and Patent Literature 7 discloses a radiant heat shield that projects to an upper portion of a sidewall and an inner side of a crucible. These patent literatures are considered to have an effect to keep the straight body of the crucible warm and prevent SiO from adhering.

Finally, as to the problem of solidification of the raw material melt, for example, Patent Literature 8 discloses a technology of reflecting radiant heat by a heat shielding ring to keep the vicinity of an interface warm. Further, Patent Literature 9 discloses a technology of keeping a space below an upper ring warm by the upper ring installed above a quartz crucible to enable suppressing solidification of a raw material melt.

As described above, various measures have been taken to several conceivable causes of the occurrence of dislocations thus far as attempts of prevention. However, taking these measures fails to completely suppress the occurrence of dislocations in a crystal, and efforts to reduce the occurrence of dislocations, e.g., modification of the quartz crucible or optimization of various operation conditions are continued on a daily basis. Further, in recent years, growth of demands for crystals that have no defect when the crystals are grown has become prominent. To grow the defect-free crystal, a temperature gradient within a crystal plane must be maintained uniform. To uniform this temperature gradient within the crystal plane, assuring a longer distance between the gas flow guide cylinder or the heat shielding ring and a liquid surface of the raw material melt has been carried out, heat retaining properties of the liquid surface of the raw material melt are consequently reduced, and the raw material melt is solidified, resulting in a cause of the occurrence of dislocations.

CITATION LIST

Patent Literatures

Patent Literature 1: Japanese Unexamined Patent Application Publication No. Hei 5-9097
Patent Literature 2: Japanese Unexamined Patent Application Publication No. Sho 64-65086
Patent Literature 3: Japanese Unexamined Patent Application Publication No. Hei 9-183686
Patent Literature 4: Japanese Unexamined Patent Application Publication No. Hei 6-340490
Patent Literature 5: Japanese Unexamined Patent Application Publication No. 2001-10890
Patent Literature 6: Japanese Unexamined Patent Application Publication No. Hei 9-278581
Patent Literature 7: Japanese Unexamined Patent Application Publication No. 2000-119089
Patent Literature 8: Japanese Unexamined Patent Application Publication No. Hei 5-105578
Patent Literature 9: Japanese Unexamined Patent Application Publication No. Hei 5-221779
Patent Literature 10: Japanese Unexamined Patent Application Publication No. 2012-148918

SUMMARY OF THE INVENTION

Technical Problem

In view of the above-described problems, it is an object of the present invention to provide a silicon single crystal growing apparatus and a method for growing silicon single crystal that enable maintaining heat retaining properties of a liquid surface of a raw material melt and suppressing occurrence of dislocations due to solidification and others even though a distance between a gas flow guide cylinder or a heat shielding member and the liquid surface of the raw material melt is large.

Solution to Problem

To solve the problem, according to the present invention, there is provided a silicon single crystal growing apparatus based on a Czochralski method for arranging a graphite crucible inside a graphite heater for heating and a quartz crucible inside the graphite crucible and growing a crystal from a raw material melt filling the quartz crucible, the apparatus including:
a heater outer heat-insulating member provided outside the graphite heater; a crucible lower heat-insulating member provided below the graphite crucible; a crucible upper heat-insulating member provided above straight bodies of the graphite crucible and the quartz crucible; a crucible outer heat-insulating member placed outside the straight body of the graphite crucible when the graphite crucible moves up; a crucible inner heat-insulating member provided inside the straight bodies of the graphite crucible and the quartz crucible; and a heat shielding member provided above a liquid surface of the raw material melt, the graphite crucible and the quart crucible being movable upward and downward in a crystal growth axis direction in a space enclosed with the crucible upper heat-insulating member, the crucible outer heat-insulating member, and the crucible inner heat-insulating member.

Such a silicon single crystal growing apparatus can maintain heat retaining properties of the liquid surface of the raw material melt and suppress occurrence of dislocations due to solidification or the like even though a distance between the gas flow guide cylinder or the heat shielding member and the liquid surface of the raw material melt is large.

Furthermore, each of the heater outer heat-insulating member, the crucible lower heat-insulating member, the crucible upper heat-insulating member, the crucible outer heat-insulating member, the crucible inner heat-insulating member, and the heat shielding member is preferably made of carbon fibers or glass fibers, and a surface of each of these members is preferably protected by a graphite material or a quartz material.

Using such heat-insulating members enables maintaining the heat retaining properties in a higher-temperature range, suppressing silicification due to a reaction of the heat-insulating members and silicon, and hardly producing impurities.

Moreover, it is preferable for a temperature gradient of the graphite crucible in a crystal growth axis direction at a height of a liquid surface of the raw material melt to be 11° C./cm or less.

Such a temperature gradient of the graphite crucible can realize a small temperature gradient of the raw material melt and reduce the number of times of occurrence of dislocations due to solidification of the raw material melt.

Additionally, the present invention provides a method for growing silicon single crystal based on a Czochralski method for arranging a graphite crucible inside a graphite heater for heating and a quartz crucible inside the graphite crucible and growing a crystal from a raw material melt filling the quartz crucible, wherein the crystal is grown with the use of the above-described silicon single crystal growing apparatus.

Such a method for growing silicon single crystal can maintain heat retaining properties of a liquid surface of the raw material melt and provide the silicon single crystal that has the reduced number of times of occurrence of dislocations due to solidification and others even though a distance between the gas flow guide cylinder or the heat shielding member and the liquid surface of the raw material melt is large.

Further, the present invention provides a method for growing silicon single crystal based on a Czochralski method for arranging a graphite crucible inside a graphite heater for heating and a quartz crucible inside the graphite crucible and growing a crystal from a raw material melt filling the quartz crucible, wherein a temperature gradient of the graphite crucible in a crystal growth axis direction at a height of a liquid surface of the raw material melt is set to 11° C./cm or less to grow a silicon single crystal.

The method for growing silicon single crystal using such a temperature gradient of the graphite crucible can reduce the temperature gradient of the raw material melt and assuredly suppress occurrence of dislocations due to solidification of the raw material melt, providing the silicon single crystal.

Advantageous Effects of Invention

The silicon single crystal growing apparatus and the method for growing silicon single crystal according to the present invention enable maintaining the heat retaining properties of the liquid surface of the raw material melt and suppressing the occurrence of dislocations due to, e.g., solidification even though a distance between the gas flow guide cylinder or the heat shielding member and the liquid surface of the raw material melt is large, thus providing the silicon single crystal.

DESCRIPTION OF EMBODIMENTS

Figure 1:
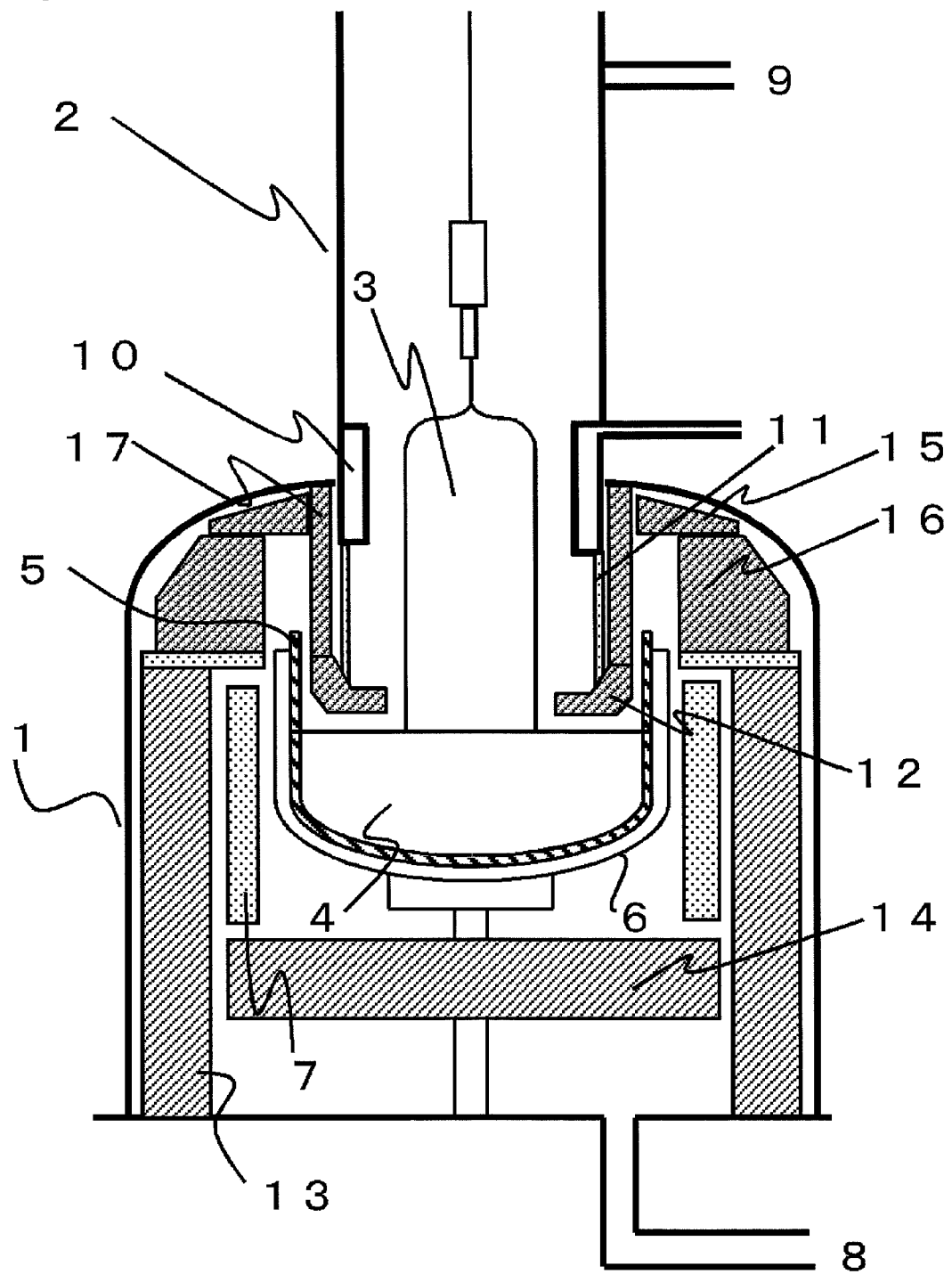
FIG. 1 is a schematic view showing an example of a silicon single crystal growing apparatus according to the present invention.

The present invention will now be more specifically described hereinafter.

The present inventors have researched circumstances where dislocations occur under various operation conditions in detail. First, they have indexed occurrence of dislocations in accordance with each operation condition and compared various kinds of data under the operation condition. They have assumed that a cause of the occurrence of dislocations that are yet to be eliminated is solidification caused due to fluctuations in temperature of a raw material melt, and studied a correlative relationship between temperatures in the vicinity of the raw material melt and various indexes. Consequently, they have discovered that a temperature gradient of a graphite crucible, especially a temperature gradient of the graphite crucible in a crystal growth axis direction at a height of a liquid surface of the raw material melt and dislocation occurrence indexes have a correlation and dislocations hardly occur as the temperature gradient becomes smaller. Since a larger temperature gradient of the graphite crucible results in a larger range of temperature fluctuations when a temperature of the raw material melt fluctuates, solidification is considered to more readily occur.

Here, to reduce the temperature gradient of the graphite crucible as well as the temperature gradient of the raw material melt, decreasing heat loss of these is important. In a silicon single crystal growing apparatus adopting the conventional CZ method, a heat-insulating member is generally arranged on the outer side of a graphite heater to achieve a reduction in heat loss of the graphite heater and the graphite crucible.

In addition, the present inventors have discovered that arranging the heat-insulating member around or below straight bodies of the graphite crucible and the quartz crucible and intensively retaining heat enables reducing the temperature gradient of the graphite crucible in a crystal growth axis direction at a height of a liquid surface of the raw material melt.

Based on the above-described knowledge, the present inventors have conceived an idea that a silicon single crystal growing apparatus having a heater outer heat-insulating member provided outside a graphite heater, a crucible lower heat-insulating member provided below a graphite crucible, a crucible upper heat-insulating member provided above straight bodies of the graphite crucible and a quartz crucible, a crucible outer heat-insulating member placed outside the straight body of the graphite crucible when the graphite crucible moves up, a crucible inner heat-insulating member provided inside the straight bodies of the graphite crucible and the quartz crucible, and a heat shielding member provided above a liquid surface of a raw material melt can reduce a temperature gradient of the graphite crucible in a crystal growth axis direction at a height of the liquid surface of the raw material melt and occurrence of dislocations in a single crystal can be consequently improved, bringing the present invention to completion.

Although the present invention will now be described hereinafter in detail with reference to the drawings, the present invention is not restricted thereto.

FIG. 1 is a schematic view showing an example of a silicon single crystal growing apparatus according to the present invention.

Characteristics of the present invention lie in a technology to intensively keep a straight body of a graphite crucible warm. In a silicon single crystal growing apparatus based on the CZ method, a seed crystal is immersed in a raw material melt 4 filling a quartz crucible 5 supported by a graphite crucible 6 in a main chamber 1, and then a single crystal ingot 3 is pulled from the raw material melt 4. The graphite crucible 6 and the quartz crucible 5 can be moved up and down in a crystal growth axis direction, and they are moved up to compensate lowering of a liquid surface of the raw material melt 4 reduced due to crystallization during crystal growth. Thus, when a length of the single crystal ingot 3 which is in a growth process becomes longer, an upper end of a straight body of the graphite crucible 6 becomes closer to a cooling cylinder 10 cooled by, e.g., cooling water in an upper portion or to a ceiling portion of the main chamber 1, and heat loss from this portion increases. In the present invention, to avoid this, a crucible lower heat-insulating member 14, a crucible upper heat-insulating member 15, a crucible outer heat-insulating member 16, and a crucible inner heat-insulating member 17 as well as a heater outer heat-insulating member 13 on the outer side of a graphite heater 7 are provided, and a space in which the graphite crucible 6 and the quartz crucible 5 can be moved up and down in the crystal growth axis direction is formed on the inner side of the crucible upper heat-insulating member 15, the crucible outer heat-insulating member 16, and the crucible inner heat-insulating member 17 to retain heat of the straight body of the graphite crucible 6, reducing the heat loss from this portion.

It is to be noted that the crucible lower heat-insulating member 14 reduces the heat loss from the graphite crucible 6 to the lower side. When the heat loss from the graphite crucible 6 to the lower side is large, power of the graphite heater 7 rises to compensate the heat loss, a temperature gradient of the graphite crucible 6 consequently increases, and hence the crucible lower heat-insulating member 14 that reduces this heat loss is required.

Moreover, a heat shielding member 12 having a heat insulator made of carbon fibers or glass fibers is arranged near an interface between the raw material melt 4 and the single crystal ingot 3 to surround the single crystal ingot 3. This heat shielding member 12 can suppress radiant heat from the raw material melt 4 to the growing single crystal ingot 3. Although a material of the heat shielding member 12 is not restricted in particular, the heat insulator which is protected by for example, graphite, molybdenum, tungsten, silicon carbide, or a material provided by covering a surface of the graphite with the silicon carbide is available.

The above-described structure can reduce the heat loss as a first advantage, and it can also prevent volatile silicon oxide (SiO) from adhering to an upper side of the crucible as another advantage. As described above, the volatile SiO adheres to and solidifies on a cooled portion, and it falls into the raw material melt to cause dislocations. However, covering the upper side of the graphite crucible and the quarts crucible with the crucible upper heat-insulating member eliminates low-temperature portions above the graphite crucible and the quartz crucible, and SiO can be thereby prevented from adhering. Furthermore, the SiO is carried to the lower side on a stream of an Ar gas that flows out from a gas inlet 9 and is sucked into a vacuum pump provided ahead of a gas outlet 8 via a gas flow guide cylinder 11, thus being prevented from adhering to portions above the raw material melt 4.

Moreover, each of the heat-insulating members mentioned above is preferably a heat insulator that can be used at high temperatures, e.g., carbon fibers or glass fibers. However, a surface of such a heat-insulating member is fibrous, dust is apt to be produced when the heat-insulating member is degraded, and the heat-insulating member may react with silicon to silicify. Thus, suppressing silicification of the heat-insulating member is required, protecting the surface with a material that is stable at high temperatures, e.g., a tabular graphite material or quartz material is further preferable.

In case of protecting the surface of each heat-insulating member with the graphite material or the quartz material, the entire heat-insulating member may be surrounded and protected, or a surface of the same close to the raw material melt, which easily silicifies and leads to a problem when fibers fall thereinto, alone may be protected.

Growing a crystal with the use of a silicon single growing apparatus having the above-described equipment and having a temperature gradient of the graphite crucible 6 in the crystal growth axis direction at a height of the liquid surface of the raw material melt 4 being 11° C./cm or less enables reducing the number of times of occurrence of dislocations.

Figure 4:
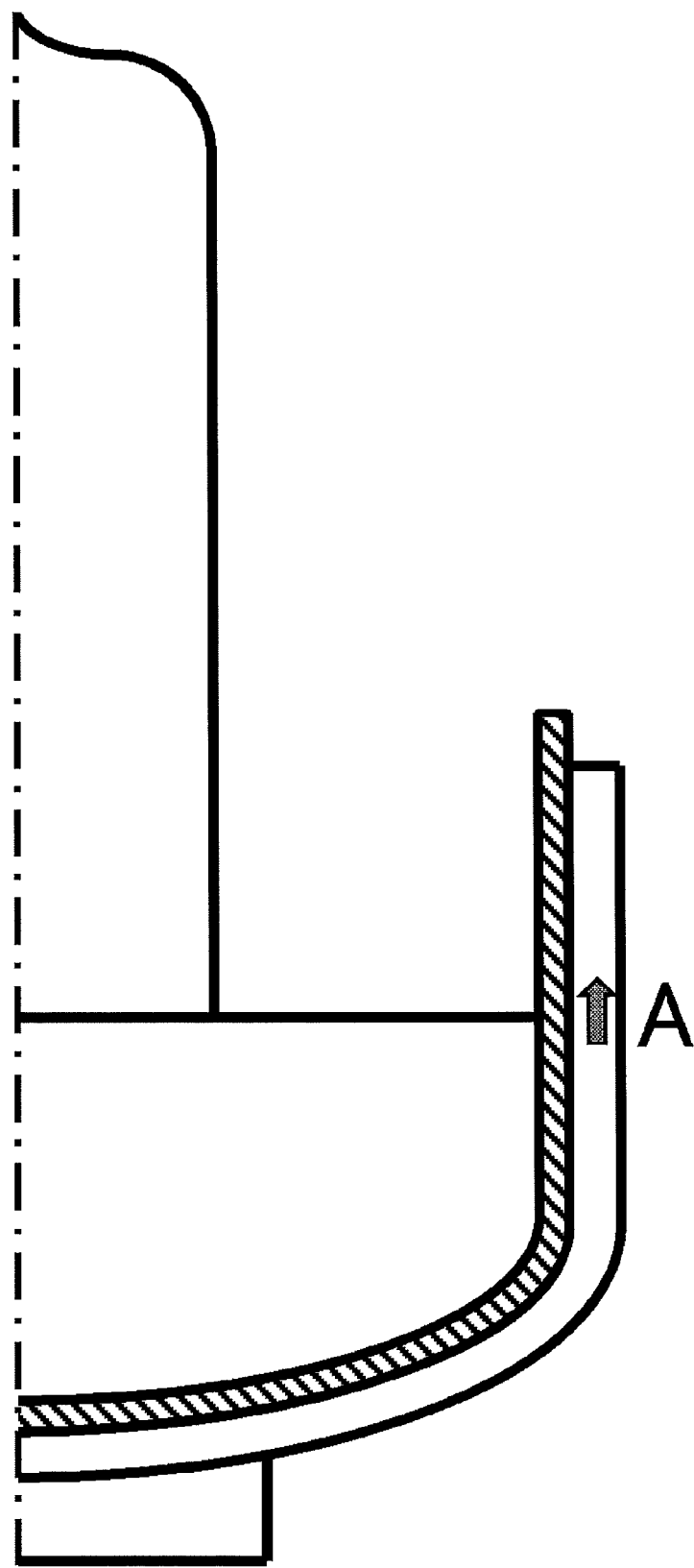
FIG. 4 is a cross-sectional view showing a position where a temperature gradient of a graphite crucible is calculated in each of an example and comparative examples.

Here, the temperature gradient of the graphite crucible in the crystal growth axis direction at the height of the liquid surface of the raw material melt is a value obtained by a temperature analysis simulation such as FEMAG. A position at which a temperature gradient was specifically obtained is a portion indicated by "A" in FIG. 4.

As an index of solidification occurrence suppression of the raw material melt, a temperature gradient of the raw material melt is basically used rather than the temperature gradient of the graphite crucible or the quartz crucible, and its value should be reduced, but a gradient value greatly varies in a raw material melt temperature calculation in the simulation depending on whether convection such as natural convection or forced convection should be taken into consideration, and hence using the temperature gradient of the raw material melt as the index is difficult. Therefore, the temperature gradient of the graphite crucible or the quartz crucible that is proportionate to the temperature gradient of the raw material melt, especially the temperature gradient of the graphite crucible having good thermal conductivity is used as the index. In case of the quartz crucible, since thermal conductivity of a quartz material is different from that of the graphite crucible, the temperature gradient of the quartz crucible must be set to a value different from the above-described value when this temperature gradient is used as the index.

It is to be noted that a value of the temperature gradient of the graphite crucible in the crystal growth axis direction at the height of the liquid surface of the raw material melt is a temperature gradient, along which a temperature lowers from the lower side toward the upper side, and fluctuates in response to a change in physical properties, e.g., thermal conductivity or emissivity of the graphite material forming the graphite crucible. Therefore, the simulation is conducted while taking these matters into consideration.

Additionally, in case of arranging the respective heat-insulating members, tightly arranging these heat-insulating members to surround the graphite crucible, the quartz crucible, and the graphite heater is ideal. However, in reality, tightly arranging each heat-insulating member is difficult for various reasons, e.g., for convenience of upward or downward movement of the quartz crucible and the graphite heater, convenience of setting, or convenience of observing the inside the furnace. Therefore, the various kinds of heat-insulating members mentioned above can be provided with, e.g., gaps as long as the above-described temperature gradient is met. Further, some of the various heat-insulating members may be divided or combined to reduce or increase the number of components.

Furthermore, a larger thickness of each heat-insulating member is preferred. However, it cannot be unlimitedly increased for the above-described reasons or due to restrictions such as a size of a main chamber. Even in such a case, the thickness can be appropriately selected as long as the above-described temperature gradient is met.

Moreover, the silicon single crystal growing apparatus according to the present invention can be combined with another technology based on the CZ method if the combination is compatible with the equipment. For example, the apparatus can be combined with, e.g., a technology disclosed in Patent Literature 10 that can improve coolability of a cooling cylinder, set a pulling rate as a high rate, thereby improve productivity and a yield rate of a single crystal, and suppress power consumption.

In the method for growing silicon single crystal according to the present invention, the temperature gradient of the graphite crucible in the crystal growth axis direction at the height of the liquid surface of the raw material melt is set to 11° C./cm or less, preferably 10° C./cm or less to grow a silicon single crystal.

A method for setting the temperature gradient of the graphite crucible in the crystal growth axis direction at the height of the liquid surface of the raw material melt to 11° C./cm or less might include using the silicon single crystal growing apparatus having the equipment for intensively keeping the straight body and the lower portion of the graphite crucible warm. The use of this apparatus enables reducing the temperature gradient of the raw material melt and providing a silicon single crystal in which the occurrence of dislocations due to solidification of the raw material melt is assuredly suppressed.

Such a method for growing silicon single crystal is a method carried out based on the CZ method, and it can be carried out by, e.g., a magnetic field applied CZ (MCZ)

method for applying a magnetic field to the raw material melt to grow a single crystal.

EXAMPLES

Although the present invention will now be more specifically described hereinafter with reference to an example and comparative examples, the present invention is not restricted thereto.

Comparative Example 1

Figure 2:
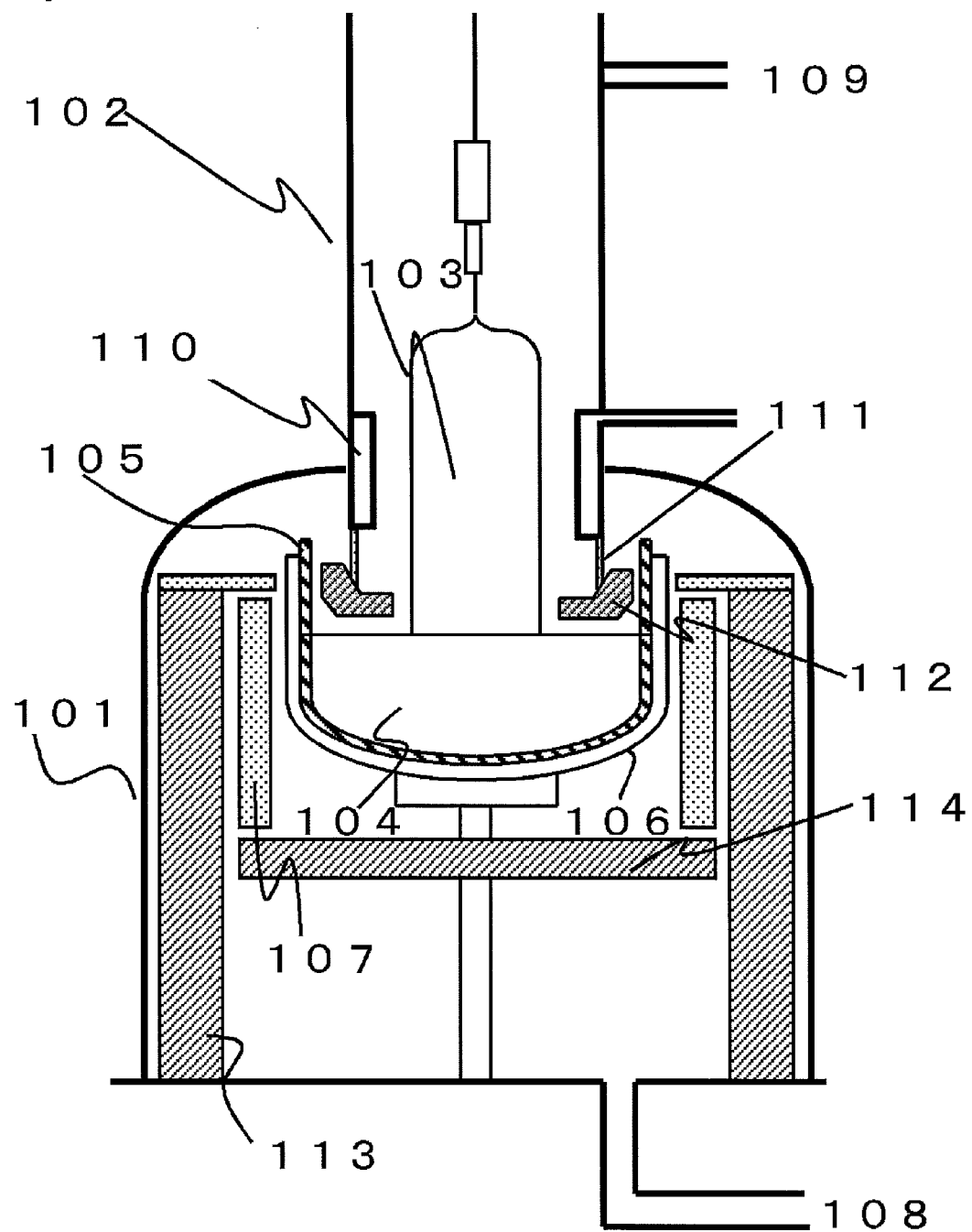
FIG. 2 is a schematic view of a silicon single crystal growing apparatus used in Comparative Example 1.

Many 300-mm crystals (an actual thickness is approximately 305 to 307 mm) were grown from a crucible having a diameter of 32 inches (813 mm) with the use of a single crystal growing apparatus shown in FIG. 2. Although the apparatus shown in FIG. 2 has a heater outer heat-insulating member 113 and a thin crucible lower heat-insulating member 114, it does not have a heat-insulating member that keeps straight bodies or upper portions of a graphite crucible 106 and a quartz crucible 105 warm.

Comparative Example 2

Figure 3:
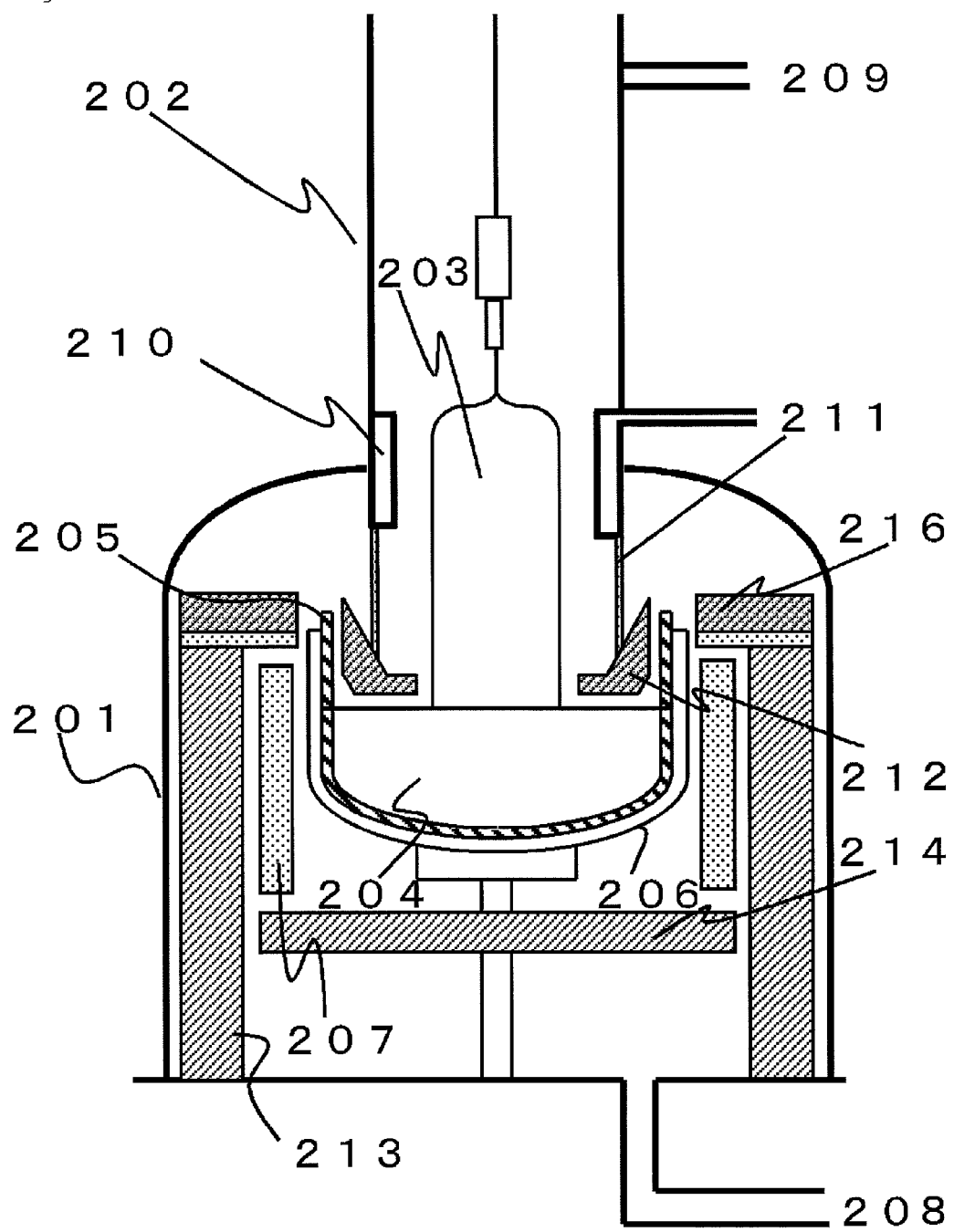
FIG. 3 is a schematic view of a silicon single crystal growing apparatus used in Comparative Example 2.

Many 300-mm crystals (an actual thickness is approximately 305 to 307 mm) were grown from a crucible having a diameter of 32 inches (813 mm) with the use of a single crystal growing apparatus shown in FIG. 3. The apparatus in FIG. 3 has a heater outer heat-insulating member 213, a thin crucible lower heat-insulating member 214, and a large heat shielding member 212 provided inside a quartz crucible 205, and it also has a small heat shielding member 216 provided outside a graphite crucible 206 to face the former. However, the apparatus does not have a crucible upper heat-insulating member and a crucible inner heat-insulating member.
(Research)

Circumstances of occurrence of dislocations when many crystals were grown were indexed in the above-described comparative examples. The importance of the occurrence of dislocations varies depending on positions where dislocations occur despite the same kind of occurrence of dislocations. For example, when a single crystal ingot of 170 cm was grown, dislocations do not occur in a straight body, but dislocations occur in an end portion of tail, and an initially designed product can be entirely provided if slip back does not reach to the straight body. However, for example, when a single crystal ingot of 170 cm was likewise grown, occurrence of dislocations at a position of 120 cm in the straight body and slip back of approximately 40 cm can cause a resultant product to have a length that is approximately a half of 170 cm which is the initially designed length. Thus, to reflect the importance of occurrence of dislocations, the following dislocation occurrence index was provided.

An initially designed product length is determined as 100, and an actually obtained product length is represented in %. That is, the dislocation occurrence index=(the obtained product length/the designed product length)×100 is defined. A result provided by averaging such lengths in all grown crystals is determined as the dislocation occurrence index. For example, assuming that 9 out of 10 crystals have no dislocation and one crystal having dislocations therein has a half of the product length, the dislocation occurrence index is (100×9+50×1)/10=95.

The dislocation occurrence index obtained in Comparative Example 1 is a value that is as very low as 64. On the other hand, the counterpart in Comparative Example 2 is 88 which is a slightly lower value. Furthermore, in Comparative Example 1, the number of times of occurrence of dislocations is large, and many dislocations were observed in a front half of the straight body. On the other hand, Comparative Example 2 has a smaller number of times of occurrence of dislocations than Comparative Example 1, but dislocations were mainly observed in a latter half of the straight body. As reasons for this, in Comparative Example 2, it is considered that upward protrusion of the upper ends of the straight bodies of the graphite crucible and the quartz crucible through a region where heat is retained by the heat shielding member and the crucible outer heat-insulating member in the latter half of the straight body of the single crystal ingot cooled the upper end portion of the quartz crucible to precipitate SiO or increase the temperature gradient of the graphite crucible.

Under conditions where the dislocation occurrence indexes differ, a correlation between different points and various parameters was studied. In particular, when heat loss of each of the graphite crucible and the quartz crucible increases due to a difference in how dislocations occur under conditions of Comparative Example 1 and Comparative Example 2, a small temperature fluctuation is presumed to cause solidification and lead to occurrence of dislocations. Thus, relevance between the raw material melt and the temperature gradient of the graphite crucible provided by FEMAG was checked, and a strong correlation was consequently observed. A temperature gradient value of the graphite crucible is 14.6° C./cm in Comparative Example 1, and the same is 11.8° C./cm in Comparative Example 2. It is to be noted that a calculation value when the straight body of the single crystal was grown to be 100 cm was used as the temperature gradient (see FIG. 4). Except for timing immediately after start of growth of the straight body or a case where a situation extremely changes, the temperature gradient does not greatly vary, calculating the temperature gradients at typical positions enables comparison. Comparing both temperature gradient values, it can be considered that heat loss was generated toward the upper portion through the straight body of the graphite crucible in each comparative example, solidification was thereby brought about, and many dislocations occurred.

Example

Based on the above-described results, an apparatus shown in FIG. 1 was prepared. This apparatus has a thicker crucible lower heat-insulating member 14 than that in the apparatus of FIG. 3 used in Comparative Example 2, also has a crucible upper heat-insulating member 15, a crucible outer heat-insulating member 16, and a crucible inner heat-insulating member 17 arranged in a portion to which crucibles 5 and 6 move up, and also retains heat of straight bodies of the graphite crucible 6 and the quartz crucible 5 that move up, thereby achieving a reduction in heat loss. A temperature gradient of the graphite crucible at a height of a liquid surface of a raw material melt in Example is as very small as 6.6° C./cm, which is a value smaller than or equal to 11° C./cm.

Figure 5:
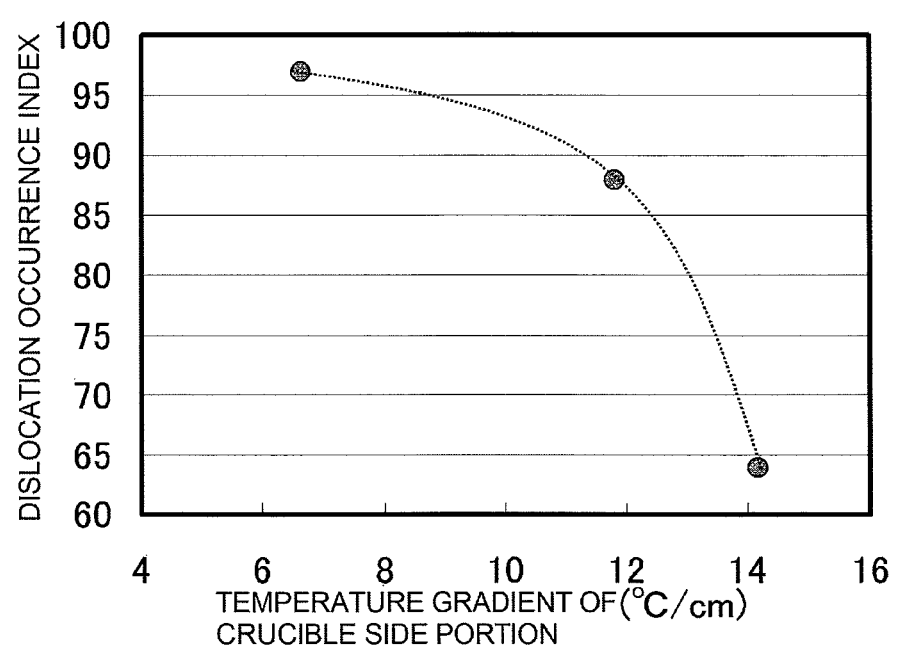
FIG. 5 is a graph showing a correlative relationship between a temperature gradient and a result of dislocation occurrence indexing in each of the example and the comparative examples.

Many crystals were grown under the conditions of Example. As a result, the dislocation occurrence index was 97 which is a very good value. It can be considered that the temperature gradient of the graphite crucible at the height of the liquid surface of the raw material melt dropped by reducing the heat loss from the graphite crucible and the number of times of occurrence of dislocations due to solidification was reduced. FIG. 5 shows a view in which research results including Comparative Examples mentioned above and a result of Example are plotted. It can be understood that the temperature gradient of the graphite crucible and the dislocation occurrence index have a correlation. It is found out from the correlation shown in FIG. 5 that the dislocation occurrence index assuredly becomes 90 or more by setting the temperature gradient of the graphite crucible to 11° C./cm or less and an output corresponding to 90% or more of an initially set product amount can be securely assured. This can be said to be a numerical figure that enables stable production for CZ single crystal manufacture having a tendency to lower an output amount due to the occurrence of dislocations and cause a fluctuation in quantity of products.

The above has demonstrated that using the silicon single crystal growing apparatus and the method for growing silicon single crystal according to the present invention enables maintaining heat retaining properties of the liquid surface of the raw material melt and suppressing the occurrence of dislocations due to solidification and others.

It is to be noted that the present invention is not restricted to the foregoing embodiment. The foregoing embodiment is an illustrative example, and any example that has substantially the same structure and exercises the same functions and effects as the technical concept described claims of the present invention is included in the technical scope of the present invention.

The invention claimed is:

1. A silicon single crystal growing apparatus based on a Czochralski method for arranging a graphite crucible inside a graphite heater for heating and a quartz crucible inside the graphite crucible and growing a crystal from a raw material melt filling the quartz crucible, the apparatus comprising:
   a heater outer heat-insulating member provided outside the graphite heater;
   a crucible lower heat-insulating member provided below the graphite crucible;
   a crucible upper heat-insulating member provided above straight bodies of the graphite crucible and the quartz crucible;
   a crucible outer heat-insulating member placed outside the straight body of the graphite crucible when the graphite crucible moves up;
   a crucible inner heat-insulating member provided inside the straight bodies of the graphite crucible and the quartz crucible;
   a heat shielding member provided above a liquid surface of the raw material melt;
   a gas flow guide cylinder provided inside the crucible inner heat-insulating member; and
   a cooling cylinder provided at an upper end of the gas flow guide cylinder, the heat shielding member being arranged at a lower end of the gas flow guide cylinder, the graphite crucible and the quart crucible being movable upward and downward in a crystal growth axis direction in a space enclosed with the crucible upper heat-insulating member, the crucible outer heat-insulating member, and the crucible inner heat-insulating member.

2. The silicon single crystal apparatus according to claim 1, wherein each of the heater outer heat-insulating member, the crucible lower heat-insulating member, the crucible upper heat-insulating member, the crucible outer heat-insulating member, the crucible inner heat-insulating member, and the heat shielding member is made of carbon fibers or glass fibers, and a surface of each of the heater outer heat-insulating member, the crucible lower heat-insulating member, the crucible upper heat-insulating member, the crucible outer heat-insulating member, the crucible inner heat-insulating member, and the heat shielding member is protected by a graphite material or a quartz material.

3. The silicon single crystal growing apparatus according to claim 1, wherein a temperature gradient of the graphite crucible in a crystal growth axis direction at a height of a liquid surface of the raw material melt is 11° C./cm or less.

4. The silicon single crystal growing apparatus according to claim 2, wherein a temperature gradient of the graphite crucible in a crystal growth axis direction at a height of a liquid surface of the raw material melt is 11° C./cm or less.

5. A method for growing silicon single crystal based on a Czochralski method for arranging a graphite crucible inside a graphite heater for heating and a quartz crucible inside the graphite crucible and growing a crystal from a raw material melt filling the quartz crucible, wherein the crystal is grown with the use of the silicon single crystal growing apparatus according to claim 1.

6. A method for growing silicon single crystal based on a Czochralski method for arranging a graphite crucible inside a graphite heater for heating and a quartz crucible inside the graphite crucible and growing a crystal from a raw material melt filling the quartz crucible, wherein the crystal is grown with the use of the silicon single crystal growing apparatus according to claim 2.

7. A method for growing silicon single crystal based on a Czochralski method for arranging a graphite crucible inside a graphite heater for heating and a quartz crucible inside the graphite crucible and growing a crystal from a raw material melt filling the quartz crucible, wherein the crystal is grown with the use of the silicon single crystal growing apparatus according to claim 3.

8. A method for growing silicon single crystal based on a Czochralski method for arranging a graphite crucible inside a graphite heater for heating and a quartz crucible inside the graphite crucible and growing a crystal from a raw material melt filling the quartz crucible, wherein the crystal is grown with the use of the silicon single crystal growing apparatus according to claim 4.

* * * * *